United States Patent
Suh et al.

(10) Patent No.: US 6,528,353 B2
(45) Date of Patent: Mar. 4, 2003

(54) CHIP STACK-TYPE SEMICONDUCTOR PACKAGE AND METHOD FOR FABRICATING THE SAME

(75) Inventors: Hee Joong Suh, Chungcheongbuk-do (KR); Bog Kyou Lee, Chungcheongbuk-do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/727,778

(22) Filed: Dec. 4, 2000

(65) Prior Publication Data

US 2001/0000053 A1 Mar. 22, 2001
1; / 1; Mar. 22, 2001;

Related U.S. Application Data

(62) Division of application No. 09/421,252, filed on Oct. 20, 1999, now Pat. No. 6,177,721.

(30) Foreign Application Priority Data

Oct. 21, 1998 (KR) .......................................... 98-44218

(51) Int. Cl.⁷ .......................... H01L 21/44; H01L 21/48; H01L 21/50
(52) U.S. Cl. ........................ 438/121; 438/123; 438/124
(58) Field of Search .............................. 438/55, 51, 64, 438/106, 109, 121, 123, 124

(56) References Cited

U.S. PATENT DOCUMENTS

| | | | | |
|---|---|---|---|---|
| 4,991,290 A | * | 2/1991 | MacKay | 29/854 |
| 5,227,995 A | * | 7/1993 | Klink et al. | 365/63 |
| 5,375,041 A | * | 12/1994 | McMahon | 257/688 |
| 5,483,024 A | * | 1/1996 | Russell et al. | 174/524 |

(List continued on next page.)

FOREIGN PATENT DOCUMENTS

JP 408264711 * 10/1996

*Primary Examiner*—Eddie Lee
*Assistant Examiner*—Paul E Brock, II
(74) *Attorney, Agent, or Firm*—Morgan, Lewis & Bockius LLP

(57) ABSTRACT

Chip stack type semiconductor package and method for fabricating the same, the package including a lower chip having a center pad formation surface defined at a bottom thereof, an upper chip stacked on the lower chip by being adhered to a top surface of the lower chip having no center pad formed thereon and having a center pad formation surface defined at a top surface thereof, both surface adhesive insulating tapes attached on regions spaced from, and positioned left and right sides of respective center pads formed in the center pad formation surfaces of the lower chip and the upper chip, leads having inner lead portions inside of a molded body of an encapsulation resin and outer lead portions exposed outside of the molded body and both end portions of the leads attached to the both surface adhesive insulating tapes attached on left and right sides of the center pads of the upper chip and to the both surface adhesive insulating tapes attached on left and right sides of the center pads of the lower chip opposite to the both surface adhesive insulating tapes attached on left and right sides of the center pads of the upper chip, to enclose opposite sides of the upper and lower chips, conductive connection members for electrical connection of the inner lead portions of the leads with the enter pads of the lower chip and the upper chip, a molded body for encapsulating entire structure except the outer lead portions, and solder balls, external power source connection terminals, attached to bottoms of the outer lead portions, whereby providing an excellent device packing density, simplifying a fabrication process because the packaging is conducted after chips are stacked, improving a heat dissipation capability, and providing excellent mechanical and electrical reliability because extremely short protected signal lines are provided.

19 Claims, 12 Drawing Sheets

U.S. PATENT DOCUMENTS

| | | | |
|---|---|---|---|
| 5,530,292 A | * | 6/1996 | Waki et al. .................. 257/724 |
| 5,583,375 A | | 12/1996 | Tsubosaki et al. .......... 257/692 |
| 5,646,446 A | * | 7/1997 | Nicewarner et al. ........ 257/723 |
| 5,668,406 A | * | 9/1997 | Egawa .................... 174/50.59 |
| 5,939,779 A | | 8/1999 | Kim .......................... 257/692 |
| 6,002,167 A | | 12/1999 | Hatano et al. .............. 257/696 |
| 6,051,450 A | * | 4/2000 | Ohsawa et al. ............. 438/123 |
| 6,077,724 A | * | 6/2000 | Chen .......................... 438/107 |
| 6,080,931 A | | 6/2000 | Park et al. .................. 174/52.4 |
| 6,087,718 A | | 7/2000 | Cho ........................... 257/686 |
| 6,121,676 A | * | 9/2000 | Solberg ...................... 257/686 |
| 6,208,021 B1 | * | 3/2001 | Ohuchi et al. .............. 257/690 |
| 6,208,521 B1 | * | 3/2001 | Nakatsuka .................. 174/254 |
| 6,211,573 B1 | * | 4/2001 | Ichinose .................... 257/783 |
| 6,225,688 B1 | * | 5/2001 | Kim et al. .................. 257/686 |
| 6,281,577 B1 | * | 8/2001 | Oppermann et al. ........ 257/690 |

* cited by examiner

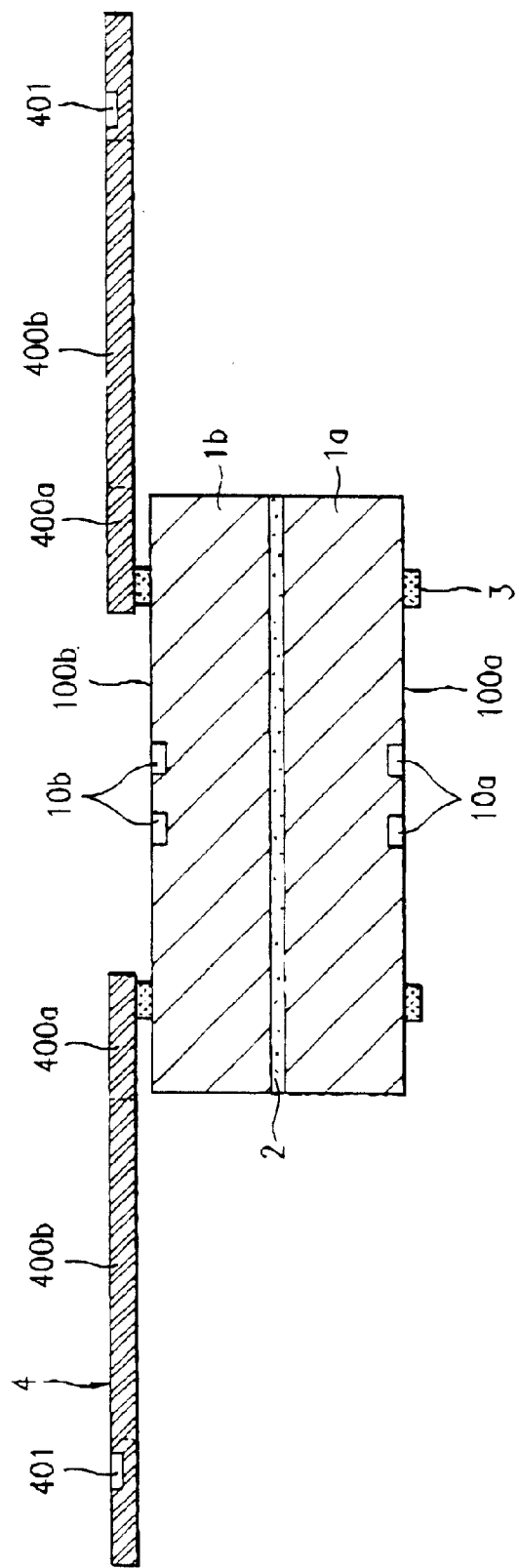

CHIP STACK-TYPE SEMICONDUCTOR PACKAGE AND METHOD FOR FABRICATING THE SAME

This is a divisional of application Ser. No. 09/421,252, filed Oct. 20, 1999, now U.S. Pat. No. 6,177,721.

BACKGROUND OF THE INVENTION

1. Field of the Invention

The present invention relates to a chip stack-type semiconductor package, and more particularly, to a chip stack-type semiconductor package and a method for fabricating the same, which has a high device packing density, a simple fabrication process owing to processing the packaging, not between semiconductor packages, but between chips, and excellent mechanical and electrical reliability owing to extremely short signal lines which are exposure protected.

2. Background of the Related Art

In general, a semiconductor device passes through an assembly process in which a wafer having integrated circuits formed thereon are separated into individual chips, and mounting the chips on a plastic or a ceramic package for easy mounting on a substrate. Thus, it may be said that main purposes of the semiconductor device packaging lie on securing a form for mounting on a substrate or socket and protection of functions of the semiconductor device. And, recently as a device packing density becomes the higher, technologies related to the assembly process, such as provision of multi-pin, micron assembly technology, and a variety of packages coming from development of a variety of mounting methods, and etc., are involved in great changes depending on sub-fields of the assembly process.

FIG. 1A illustrates a perspective view of a DIP (Dual Inline Package), and FIG. 1B illustrates a cross section showing an internal structure of the DIP in FIG. 1A. An outline of semiconductor assembly process will be explained, taking a plastic DIP which is widely used currently as an example.

In the cutting of the wafer having electric circuits formed thereon, in most of cases, since silicon is hard and brittle with a Moh's hardness of 7, a breaking force is exerted along a separation line having a material planted therein in advance in formation of the wafer for separating the wafer, to break and separate the wafer. And, the separated individual chips are bonded on a chip mounting region (die pad) 11 by Au—Si eutectoid method, soldering, or resin bonding, as necessary. The chip is bonded to the chip mounting region 11, not only for mounting on a substrate after assembly and, sometime in combination, as a terminal for electrical input/ output or earthing, but also for dispersing a heat generated in operation of the device through the chip mounting region 11. After the chip 1 is bonded, the chip and an inner lead 12*a* of a lead frame is connected with gold wire, a conductive connection member 5, by bonding mostly using thermocompression or combination of thermocompression and ultrasonic sealing in case of a plastic sealing package using gold wire. After the chip 1 an the inner lead 12*a* are connected electrically by the wire bonding, molding is conducted in which the chip is enclosed in a high purity epoxy resin which is an important element that determines a reliability of an integrated circuit, wherein improvements, such as provision of high purity resin and low stressed molding which can reduce stress to the integrated circuit, are under study. And, after the foregoing process is completed, an outer lead portion 12*b* is trimmed and formed to a required shape for mounting the IC package on a socket or a substrate, when the outer lead portion 12*b* is dipped in a plating or soldering solution for improvement of soldering effect.

In the meantime, the related art semiconductor packages are stacked when it is intended to increase a memory size, which requires very complicated process because the package units should be combined newly after the packaging is finished for fabrication of a chip stack-type package. That is, after individual packages are fabricated for individual chips by the packaging process, a process of stacking the completed individual packages should be conducted, that increases total fabrication processes and cost for fabricating the stack type semiconductor package. And, the related art stack type semiconductor package has difficulty in providing a lighter, thinner, shorter and smaller package, and poor heat dissipation.

SUMMARY OF THE INVENTION

Accordingly, the present invention is directed to a chip stack-type semiconductor package and a method for fabricating the same that substantially obviates one or more of the problems due to limitations and disadvantages of the related art.

An object of eh present invention is to provide a chip stack-type semiconductor package and a method for fabricating the same, which has a high device packing density, a simple fabrication process owing to processing the packaging after chip stacking, an excellent heat dissipation capability owing to a large heat dissipation area, and excellent mechanical and electrical reliability owing to extremely short signal lines which are exposure protected.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the chip stack type semiconductor package includes a lower chip having a center pad formation surface defined at a bottom thereof, an upper chip stacked on the lower chip by being adhered to a top surface of the lower chip having no center pad formed thereon and having a center pad formation surface defined at a top surface thereof, both surface adhesive insulating tapes attached on regions spaced from, and positioned left and right sides of respective center pads formed in the center pad formation surfaces of the lower chip and the upper chip, leads having inner lead portions inside of the molded body of an encapsulation resin and outer lead portions exposed outside of the mold body and both end portions of the leads attached to the both surface adhesive insulating tapes attached on left and right sides of the center pads of the upper chip and to the both surface adhesive insulating tapes attached on left and right sides of the center pads of the lower chip opposite to the both surface adhesive insulating tapes attached on left and right sides of the center pads of the upper chip, to enclose opposite sides of the upper and lower chips, conductive connection members for electrical connection of the inner lead portions of the leads with the center pads of the lower chip and the upper chip, a molded body for encapsulating entire structure except the outer lead portions, and solder balls, external power source connection terminals, attached to bottoms of the outer lead portions.

In other aspect of the present invention, thee is provided a method for fabricating a chip stack type semiconductor package, including the steps of (1) attaching both surface adhesive insulating tapes on a top surface of a lower chip where no center pas are formed therein, the lower chip having a center pad formation surface defined at a bottom thereof, (2) attaching an upper chip on a top surface of the both surface adhesive insulating tape to stack the upper chip on the lower chip, (3) attaching both surface adhesive insulating tapes on regions spaced from, and positioned left and right sides of respective center pads formed in the center pad formation surfaces of the lower chip and the upper chip, (4) attaching top end portion of the leads to the both surface adhesive insulating tapes attached on left and right sides of the center pads of the upper chip, and attaching bottom end portions of the leads to the both surface adhesive insulating tapes attached on left and right sides of the center pads of the lower chip opposite to the both surface adhesive insulating tapes to which the top end portions of the leads are attached, to enclose opposite sides of the upper and lower chips, thereby fitting the leads, (5) electrically connecting the top and bottom end portions of the leads to the center pads of the lower chip and the upper chip with conductive connection members, (6) conducting a resin encapsulation so as to protect the upper and lower chips and the conductive connection members, to form a molded body, and (7) attaching solder balls, external power source connection terminals, to bottoms of the lead portions outside of the molded body.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIGS. 1A and 1B illustrate one example of a related art semiconductor package, wherein FIG. 1A illustrates a perspective view of a DIP, and FIG. 1B illustrates a section across line I—I in FIG. 1A;

FIGS. 4A–4K illustrate stacking and packaging process of the chip stack type semiconductor package in accordance with a preferred embodiment of the present invention; wherein, FIG. 4A illustrates a section showing a state in which two semiconductor chips are stacked, FIG. 4B illustrates a section showing a state in which both surface adhesive insulating tape is attached to a center pad formation surface on an upper chip, FIG. 4C illustrates a section showing a state in which a lead is attached to both surface adhesive insulating tape on an upper chip, FIG. 4D illustrate a section showing a state in which a first wire bonding is completed, FIG. 4E illustrates a section showing a state at a time point in forming a lead, FIG. 4F illustrates a section showing a state after completion of the lead forming, FIG. 4G illustrates a section after completion of second wire bonding, FIG. 4H illustrates a section after completion of molding, FIG. 4I illustrates a section showing a state in which solder paste is coated inside of a groove, FIG. 4J illustrates a section showing a solder ball is fitted in the groove, FIG. 4K illustrates a section showing completion of solder ball fitting through a reflow process;

DETAILED DESCRIPTION OF THE PREFERRED EMBODIMENT

Figure 1A:
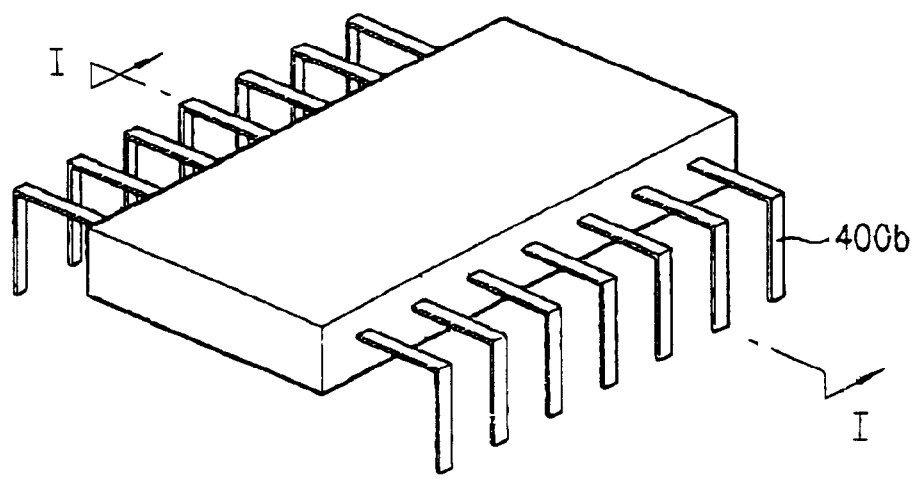
Figure 1B:
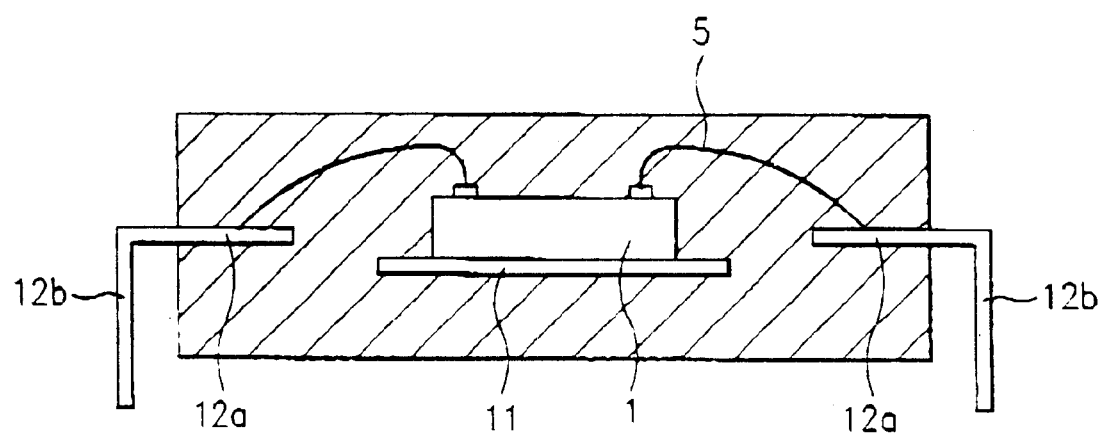
Figure 2A:
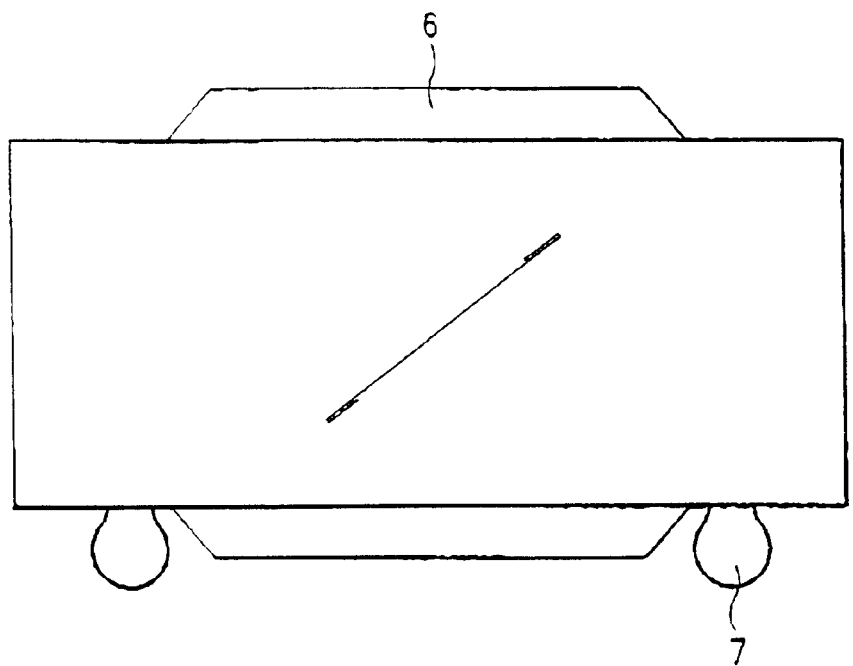
FIGS. 2A and 2B illustrate a front view and a plan view of a chip stack type package in accordance with a preferred embodiment of the present invention.
Figure 2B:
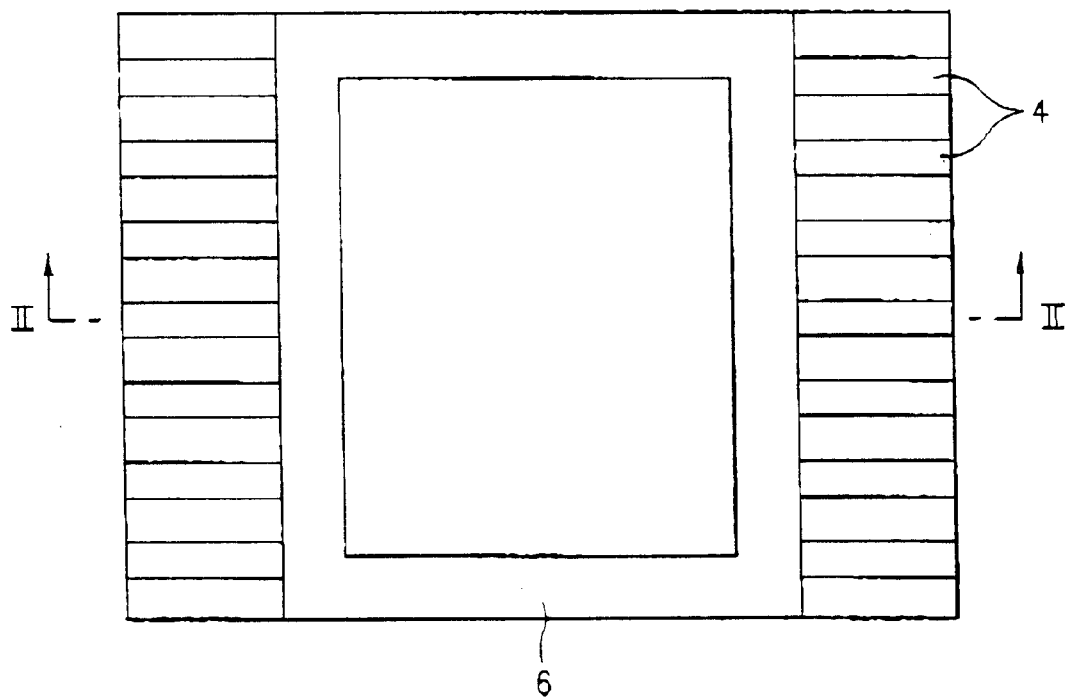
Figure 3:
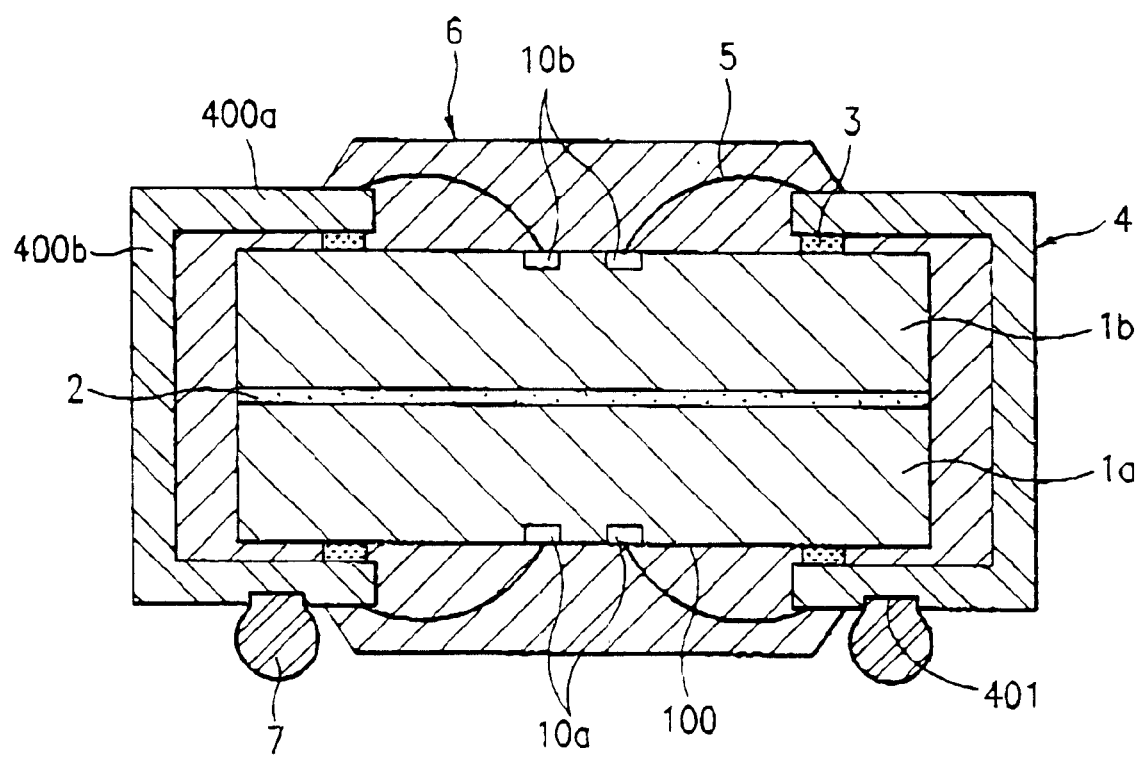
FIG. 3 illustrates a section across line II—II in FIG. 2B.

Reference will now be made in detail to the preferred embodiments of the present invention, examples of which are illustrated in the accompanying drawings. A first preferred embodiment of the present invention will be explained with reference to FIGS. 2A–5. FIGS. 2A and 2B illustrate a front view and a plan view of a chip stack type package in accordance with a preferred embodiment of the present invention, and FIG. 3 illustrates a section across line II—II in FIG. 2B.

The chip stack type semiconductor package in accordance with a preferred embodiment of the present invention includes a lower chip 1a having a center pad formation surface 100a defined at a bottom thereof, an upper chip 1b stacked on the lower chip 1b by being adhered to a top surface of the lower chip 1a having no center pad formed thereon and having a center pad formation surface 1b defined at a top surface thereof, both surface adhesive insulating tapes 3 attached on regions spaced from and positioned left and right sides of respective center pads 10a and 10b formed in the center pad formation surfaces 100a and 100b of the lower chip 1a and the upper chip 1b, channel formed leads having inner lead portions 400a inside of a molded body 6 of an encapsulation resin and outer lead portions 400b exposed outside of the molded body and top end portions attached to the both surface adhesive insulating tapes 3 attached on left and right sides of the center pads 10b of the upper chip 1b and bottom end portions attached to the both surface adhesive insulating tapes 3 attached on left and right sides of the center pads 10a of the lower chip 1a opposite to the both surface adhesive insulating tapes 3 attached on left and right sides of the center pads 10b of the upper chip 1b, to enclose opposite sides of the upper and lower chips 1a and 1b, conductive connection members 5 for electrical connection of the top portions and bottom portions of the leads 4 with the center pads 10a and 10b of the lower chip 1a and the upper chip 1b, a molded body 6 for encapsulating entire structure except the outer lead portions 400b, and solder balls 7 attached to bottom of the outer lead portions 400b of the leads 4. There is adhesive 2, such as epoxy, between the upper chip 1a and the lower chip 1b. The conductive connecting member 5 is preferably gold wire, and the encapsulation resin is preferably epoxy molding compound. And, there are grooves 401 in bottoms of the outer lead portions 400b of the leads 4 for easy attachment of the solder balls 7, and there is solder paste 8 coated on insides of the grooves 401 of the leads 4 for easy welding of the solder balls 7 attached to the grooves 401 to the leads 4 through a reflow process. A flux may be coated instead of the solder paste 8. And, outer leads 400b of respective leads 4 are exposed in top and bottom, and left and right sides of the molded body 6 for dissipation of a heat generated during operation of the lower chip 1a and the upper chip 1b through the outer lead portions 400b of the leads 4 exposed outside of the molded body 6.

Processes for stacking and packing the aforementioned chip stack type semiconductor package of the present invention will be explained with reference to FIGS. 4A and 4K in detail. Two semiconductor chips of a center pad type to be used as the lower chip 1a and the upper chip 1b, both surface adhesive insulating tape 3, and leads 4 are provided.

Figure 4A:
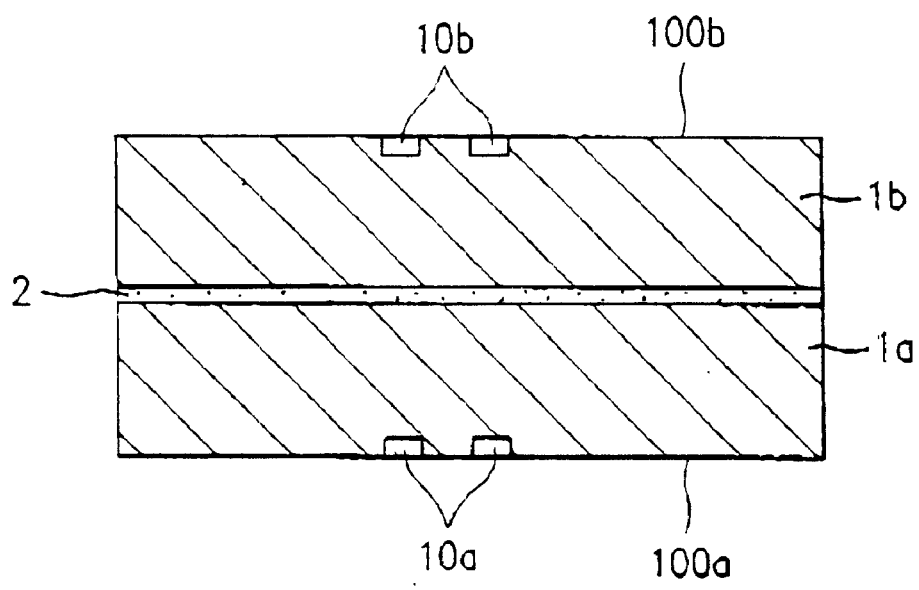
Figure 4B:
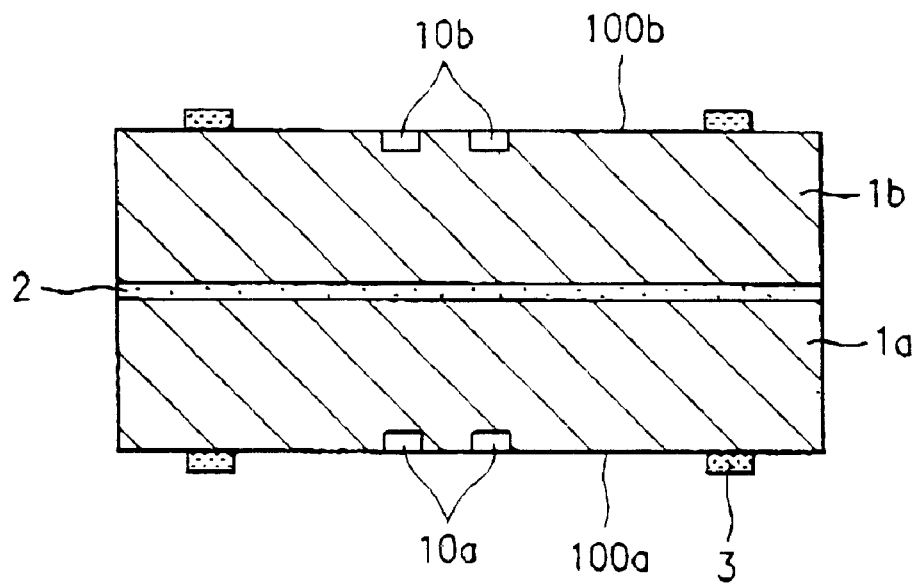
Figure 4D:
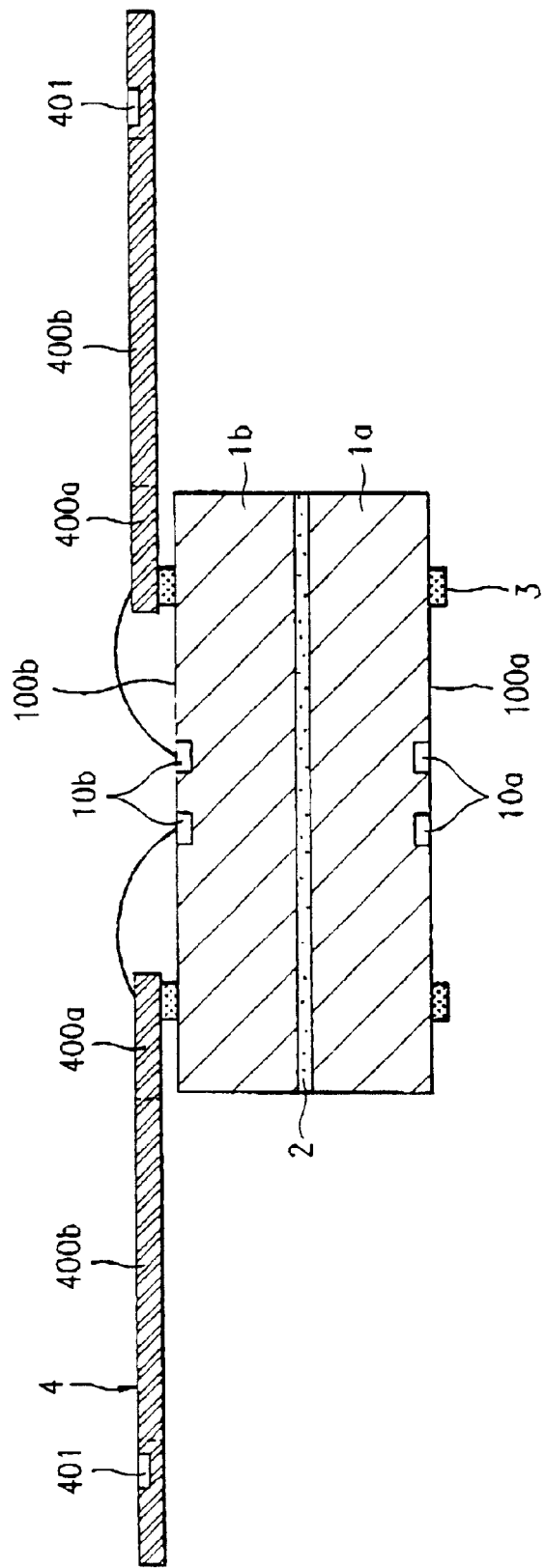
Figure 4E:
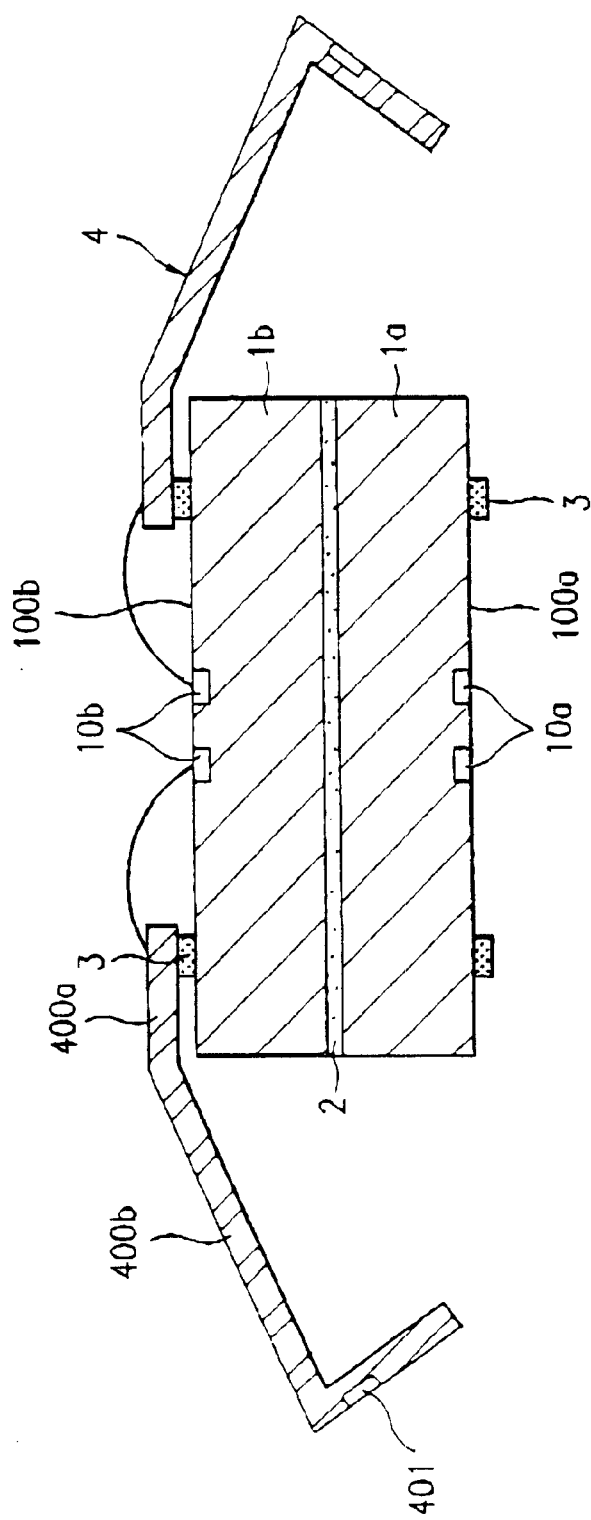
Figure 4F:
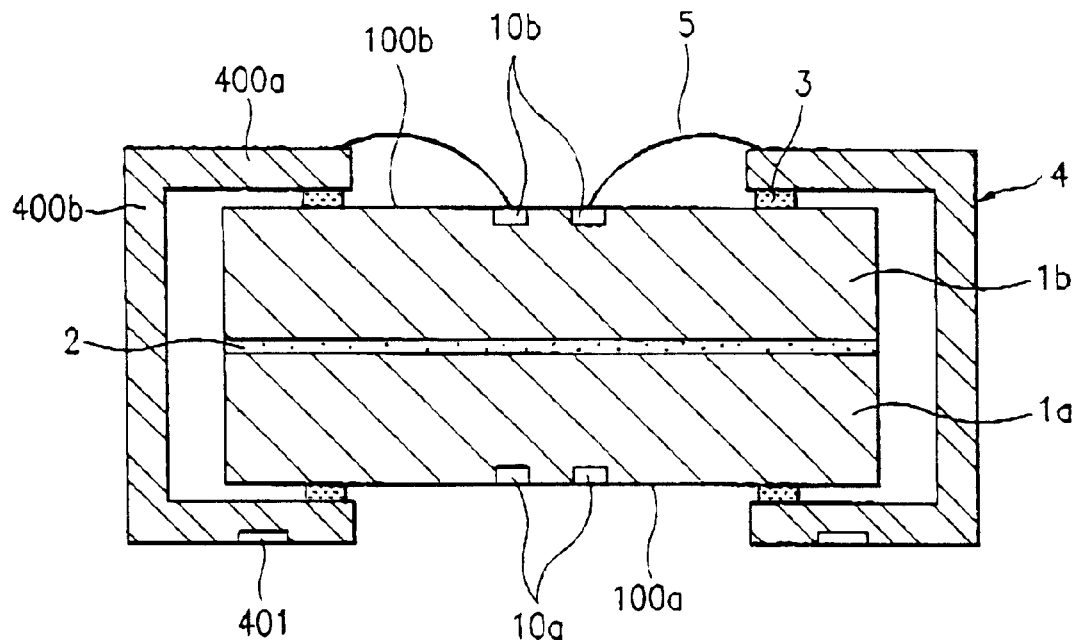
Figure 4G:
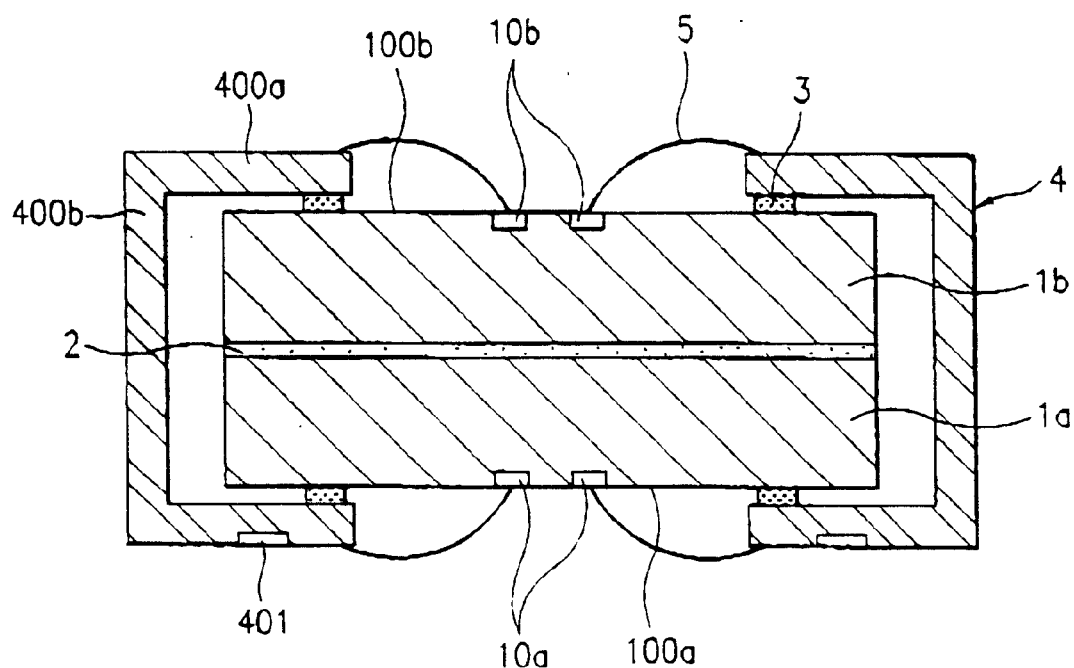
Figure 4H:
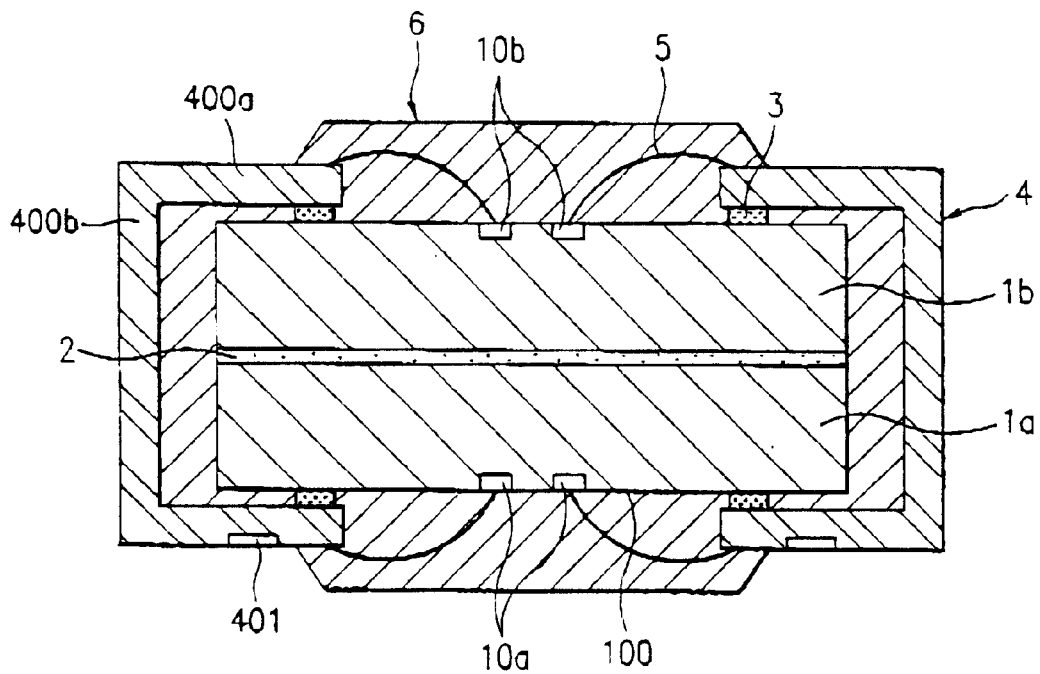
Figure 4I:
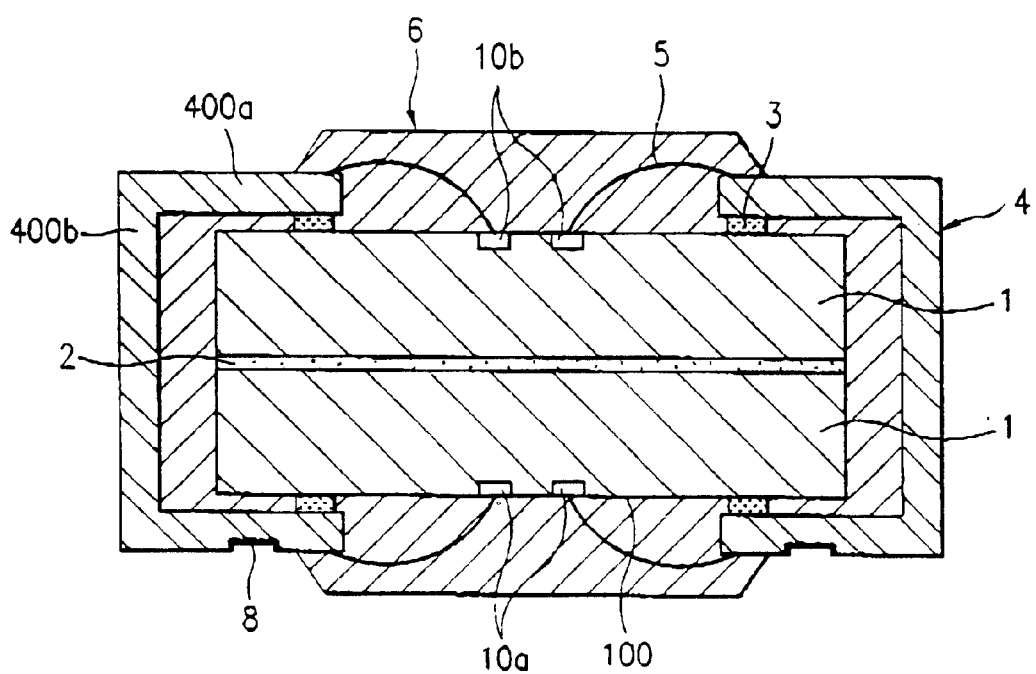
Figure 4J:
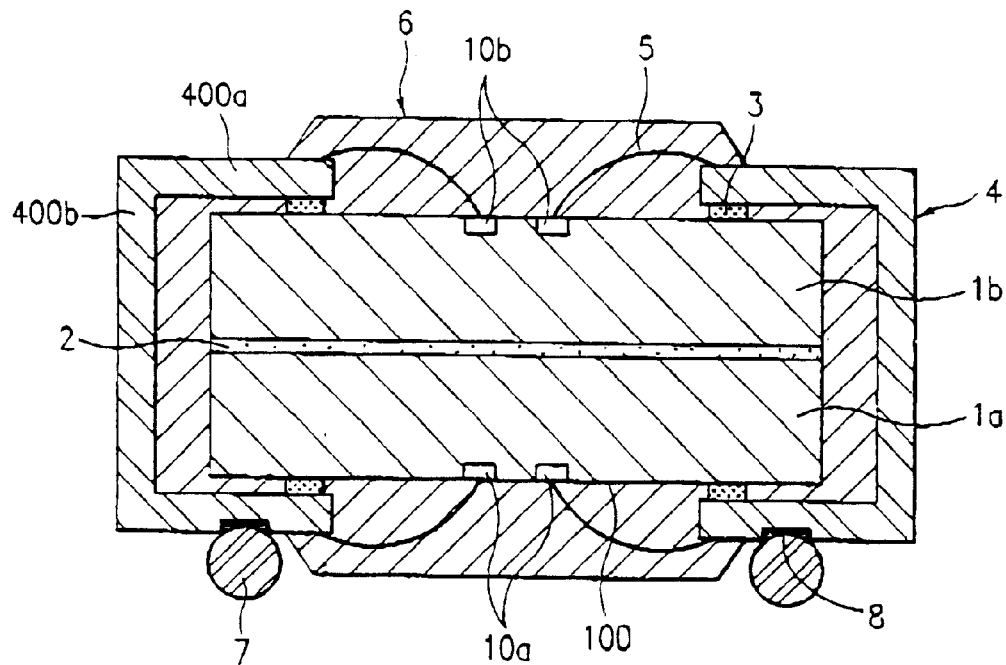
Figure 4K:
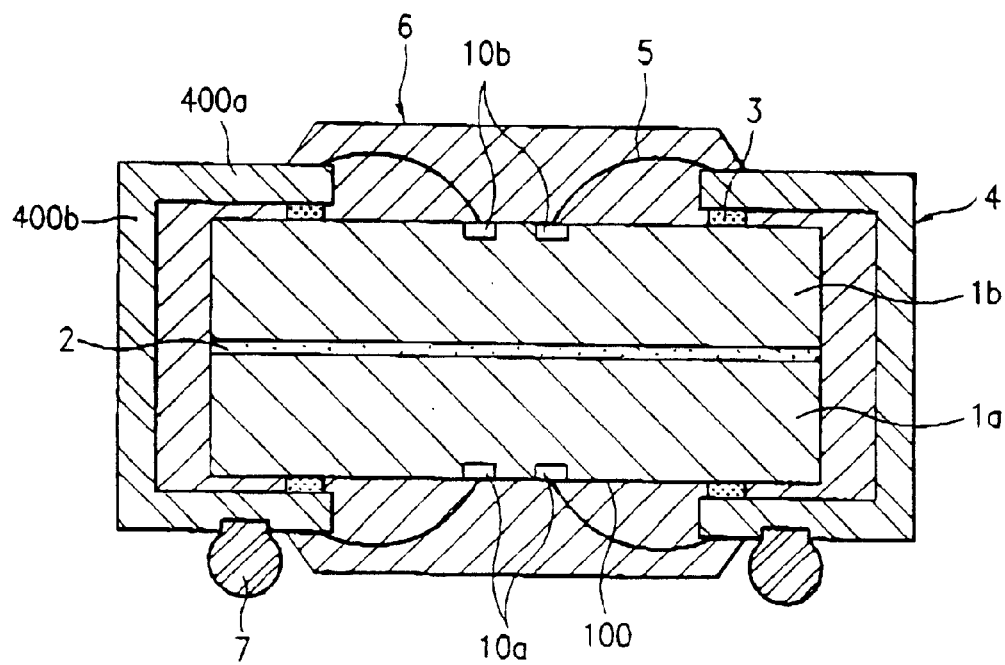
Figure 5:
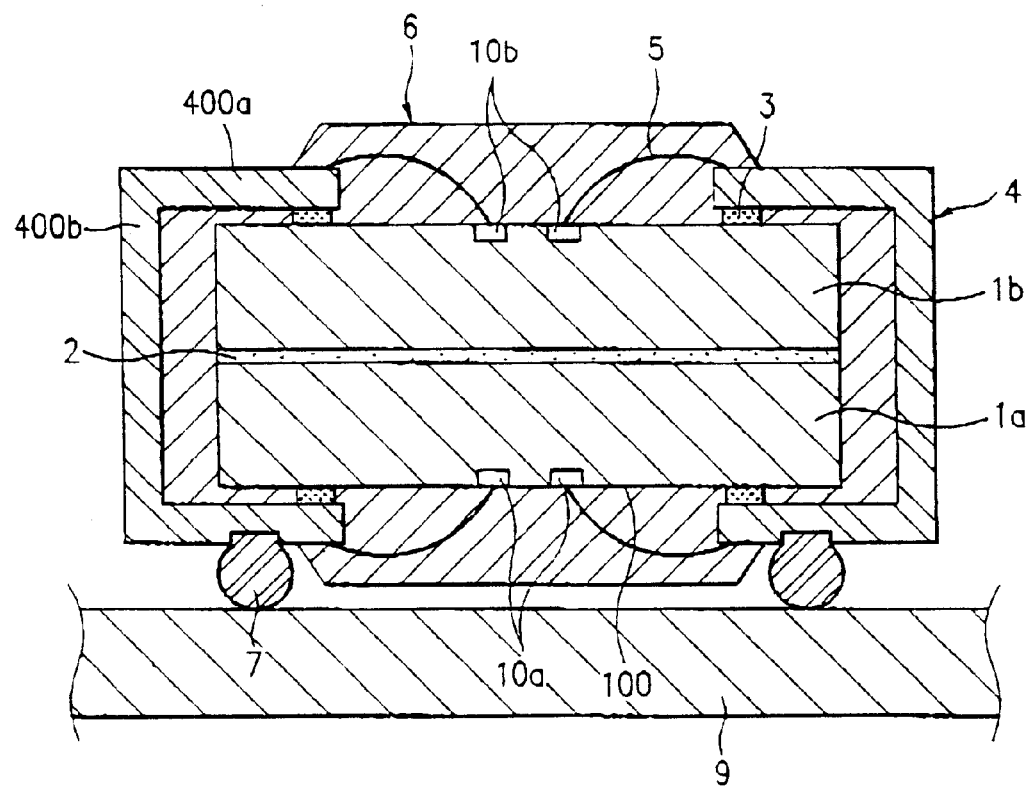
FIG. 5 illustrates a section showing a state in which a chip stack type semiconductor package of the present invention is mounted on a circuit board; and, FIGS. 6A and 6B illustrate a top view and a bottom view of a chip stack type semiconductor package in accordance with another preferred embodiment of the present invention, respectively.

Then, referring to FIG. 4A, the lower chip 1a is held with the center pad formation surface 100a faced down, and a coat of adhesive 2 is applied to the no center pad formation surface of the lower chip 1a. Then, the upper chip 1b is attached to a top portion of the lower chip 1a having the adhesive coated thereon, with the center pad formation surface 100b exposed in upper side. The coat of the adhesive is provided between the lower chip 1a and the upper chip 1b for bonding the two chips as well as electrical insulation between the two chips. As shown in FIG. 4B, after completion of stacking the chips, both side adhesive insulating tapes 3 are attached on regions of the center pad formation surfaces 100a and 100b of the center pads 10a and 10b on left and right sides of, and each spaced a distance from the center pads 10a and 10b of the lower chip 1a and the upper chip 1b. Then, as shown in FIG. 4C, leads 4 are attached such that one ends of each of the leads 4 is adhered to the both side adhesive insulating tape 3 attached on left and right sides of the center pad 10b in the top surface of the upper chip 1b. That is, one end of the lead 4 is attached on the both side adhesive insulating tape 3 on left side of the center pad 10b on the top surface of the upper chip 1b such that the lead 4 is projected in a left side of the chip, and one end of the lead 4 is attached on the both side adhesive insulating tape 3 on right side of the center pad 10b on the top surface of the upper chip 1b such that the lead 4 is projected in a right side of the chip. Then, as shown in FIG. 4D, a first wire bonding is conducted, in which the left and right side ends of the leads are electrically connected to the center pads 10b in the upper chip 1b with the conductive connecting member 5 of gold wire. As shown in FIG. 4E, respective leads 4 attached to the left and right side both side adhesive tapes 3 are formed to enclose sides of the upper and lower chips 1b and 1a in channel forms, and as shown in FIG. 4F, the other ends of the leads 4 are attached to the both side adhesive insulating tapes 3 on left and right sides of, and each spaced a distance from the center pads 10a in a bottom surface of the lower chip 1a. The forming of the leads 4 includes bending of the top portions of the leads 4 and bending of the bottom portions of the leads 4. In the meantime, provided all the forming for the left and right side leads 4 are completed, as shown in FIG. 4G, a second wire bonding is conducted, in which the other ends of the leads 4 are electrically connected to the center pads 10a in the lower chip 1a with conductive connecting members 5 of gold wire. Then, after the second wire bonding is completed, an encapsulation is conducted, for protecting the conductive connecting members 5 and the upper and lower chips 1b and 1a, when, as shown in FIG. 4H, the entire structure is encapsulated except the outer lead portions 400b of the leads 4. After completion of the encapsulation, solder balls 7 are attached to the outer lead portions 400b exposed to outside of the molded body 6 formed by hardened encapsulation resin. In this instance, the solder balls 7 can be attached with easy as there are grooves 401 formed in the bottom surface of the outer lead portions 400b exposed to outside of the molded body 6. That is, as shown in FIG. 4I, after solder paste 8 or flux is coated inside of the grooves 401 in the bottom surface of the outer leads 400b exposed to outside of the molded body 6, as shown in FIG. 4J, the solder balls 7 are fitted to the grooves 401 and subjected to a heat treatment process of reflow, to weld the solder balls 7 to an inside of the grooves 401 in the outer lead portions 400b firmly, as shown in FIG. 4K. In order to omit the lead forming process, channel formed leads 4 may be provided in advance, to attach the ends of the leads 4 to the both surface adhesive insulating tapes 3 attached on left side of the center pads 10b and 10a of the upper and lower chips 1b and 1a as well as to the both surface adhesive insulating tapes 3 attached on right side of the center pads 10b and 10a of the upper and lower chips 1b and 1a. As shown in FIG. 5, the chip stack-type semiconductor package of the present invention fabricated thus is mounted on a circuit board.

Figure 6A:
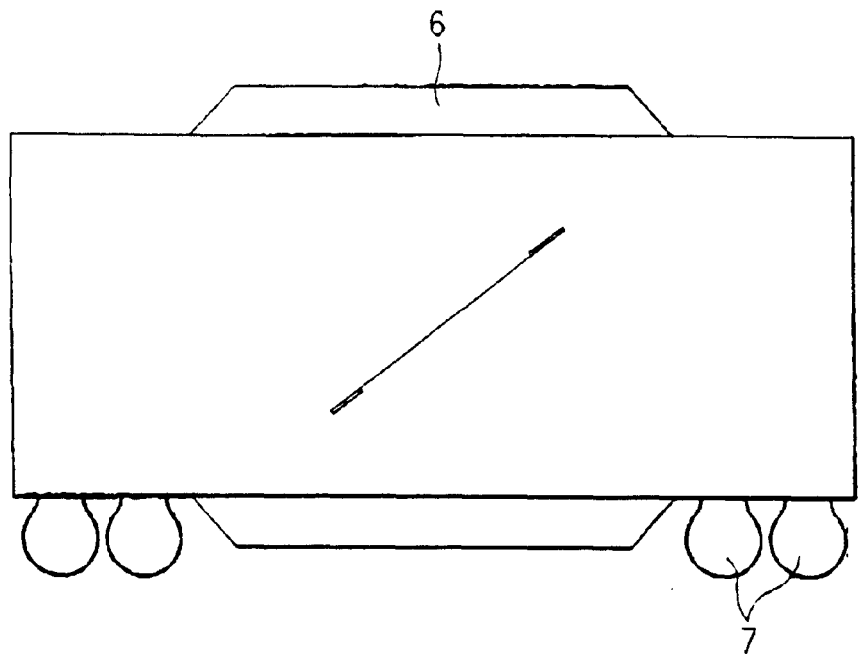
Figure 6B:
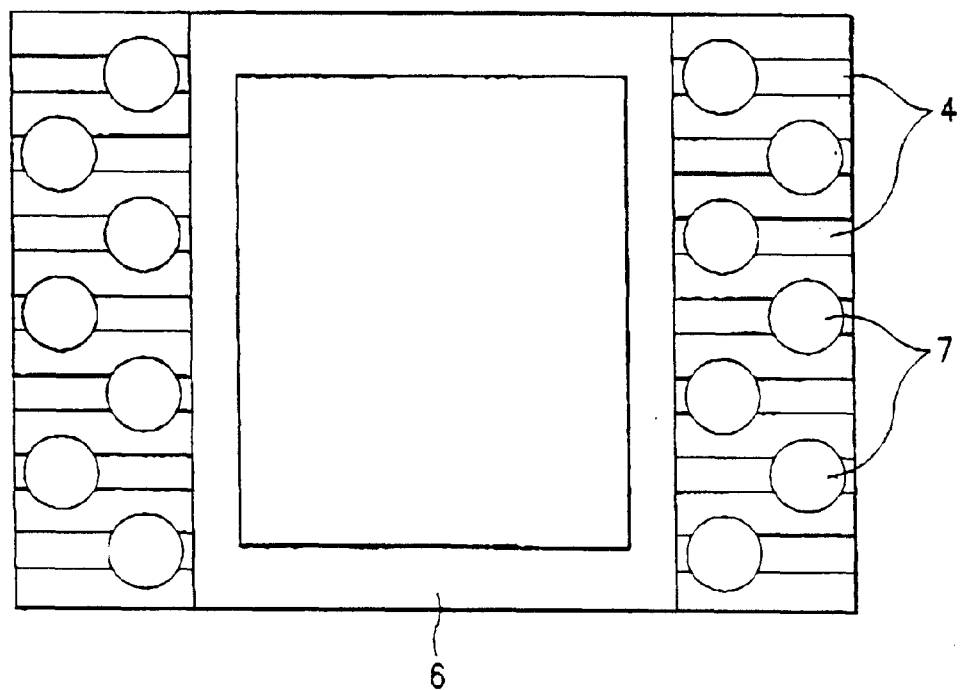

FIGS. 6A and 6B illustrate a top view and a bottom view of a chip stack type semiconductor package in accordance with another preferred embodiment of the present invention respectively, wherein the grooves 401 in the bottom portions of the leads 4 are formed in zigzag positions. Otherwise, the another embodiment of the present invention is identical to the first embodiment of the present invention. The attachment of the solder balls 7 to the leads 4 at zigzag positions permit to secure adequate insulation distances between solder balls 7.

As has been explained, the chip stack-type semiconductor package and method for fabricating the same have the following advantages.

The chip stack-type semiconductor package of the present invention permits a high density device packing, to provide a large sized memory, and to have improved mechanical and electrical reliability. That is, since the chip stack-type semiconductor package of the present invention makes a package by stacking chips, the memory size can be increased. And, the exposure of the outer lead portions to top, bottom, and sides of the molded body in the chip stack-type semiconductor package of the present invention facilitates an improvement in heat dissipation as a heat dissipation area is increased. And, because the chip stack-type semiconductor package of the present invention permits to secure adequate distances between leads, which in turn permits to increase a size of solder balls that increases an adhesive force of the solder balls to the leads, a signal transmission reliability can be improved when the package is mounted on a board. In the meantime, because the chip stack-type semiconductor package of the present invention stacks, not packages after individual packages are fabricated, but chips in a packaging stage, a fabrication process is significantly simplified in comparison to the related art stacked package fabrication in which individual chips are packaged and the individual semiconductor packages from the individual chip packaging are packaged again. Thus, as the chip stack-type semiconductor package of the present invention has extremely short signal lines, a semiconductor package can be provided, which has excellent mechanical and electrical reliability, and an increased memory size.

It will be apparent to those skilled in the art that various modifications and variations can be made in the chip stack-type semiconductor package and method for fabricating the same of the present invention without departing from the spirit or scope of the invention. Thus, it is intended that the present invention cover the modifications and variations of this invention provided they come within the scope of the appended claims and their equivalents.

What is claimed is:

1. A method for fabricating a chip stack type semiconductor package, comprising the steps of:

(1) attaching both surface adhesive insulating apes on a top surface of a lower chip where no center pads are formed therein, the lower chip having a center pad formation surface defined at the bottom thereof;

(2) attaching an upper chip on a top surface of the both surface adhesive insulating tape to stack the upper chip on the lower chip;

(3) attaching both surface adhesive insulating tapes on regions spaced from, and positioned left and right sides of respective center pads formed in the center pad formation surfaces of the lower chip and the upper chip;

(4) attaching a top end portion of a first lead to the both surface adhesive insulating tape attached on the left side of the center pad of the upper chip, attaching a top end portion of a second lead to the both surface adhesive insulating tape attached on the right side of the center pad of the upper chip, attaching a bottom end portion of the first lead to the both surface adhesive insulating tape attached on the left side of the center pad of the lower chip, and attaching a bottom end portion of the second lead to the both surface adhesive insulating tape attached on the right side of the center pad of the lower chip, the first lead being attached opposite the second lead so as to enclose opposite sides of the upper and lower chips, thereby fitting the top end portion of the first lead directly opposing the bottom end portion of the first lead, and the top end portion of the second lead directly opposing the bottom end portion of the second lead;

(5) electrically connecting the top and bottom end portions of the leads to the center pads of the lower chip and the upper chip with conductive connection members;

(6) conducting a resin encapsulation so as to protect the upper and lower chips and the conductive connection members, to form a molded body; and, (7) attaching solder balls, external power source connection terminals, to bottoms of the lead portions outside of the molded body.

2. A method as claimed in claim 1, wherein the step (4) includes the step of:

providing the leads pre-formed into C-shaped members.

3. A method as claimed in claim 1, further comprising the step of forming grooves in bottom surfaces of the outer lead portions exposed outside of the molded body of the leads for attachment of the solder balls.

4. A method as claimed in claim 3, further including the step of coating solder paste or flux on an inside of the grooves in the leads.

5. A method as claimed in claim 4, further including the steps of;

setting the solder balls to the solder paste or flux coated on inside of the grooves in the leads, and reflowing the solder balls so as to weld the solder balls to the leads.

6. A method as claimed in one of claims 3 to 5, wherein the grooves in adjacent leads are formed at zigzag positions.

7. A method for fabricating a chip stack type semiconductor package, comprising the steps of:

(1) attaching both surface adhesive insulating tapes on a op surface of a lower chip where no center pads are formed therein, the lower chip having a center pa formation surface defined at a bottom thereof;

(2) attaching an upper chip on a top surface of the both surface adhesive insulating tape to stack the upper chip on the lower chip;

(3) attaching both surface adhesive insulating tapes on regions spaced from, and positioned left and right sides of respective center pads formed in the center pad formation surfaces of the lower chip and the upper chip;

(4) attaching a top end portion of a first lead to the both surface adhesive insulating tape attached on the left side of the center pad of the upper chip, and attaching a top end portion of a second lead to the both surface adhesive insulating tape attached on the right side of the center pad of the upper chip;

(5) conducting a first wire bonding for electrically connecting left and right side ends of the leads to the center pads of the upper chip using conductive connection members;

(6) forming respective leads into C-shaped members such that the leads projected in left and right directions from the top surface of the upper chip enclose opposite sides of the upper and lower chips, and the other end portions of respective leads are attached to the both surface adhesive insulating tapes attached on regions spaced a distance from, and positioned in left and right sides of the center pads in the bottom surface of the lower chip, wherein the top end portion of the first lead is directly opposite the bottom end portion of the first lead, and the top end portion of the second lead is directly opposite the bottom end portion of the second lead;

(7) conducting a second wire bonding for electrically connecting the other end portions of the leads to the center pads in the lower chip using conductive connection members;

(8) encapsulating an entire structure excluding the outer lead portions of the leads with a resin so as to protect the upper and lower chips and the conductive connection members, to form a molded body; and, (9) attaching solder balls to the outer lead portions exposed outside of the molded body.

8. A method as claimed in claim 7, further comprising the step of forming grooves in bottom surfaces of the outer lead portions exposed outside of the molded body of the leads for attachment of the solder balls.

9. A method as claimed in claim 8, further including the step of coating solder paste or flux on an inside of the grooves in the leads.

10. A method as claimed in claim 9, further including the steps of;

setting the solder balls to the solder paste or flux coated on inside of the grooves in the leads, and reflowing the solder balls so as to weld the solder balls to the leads.

11. A method as claimed in one of claims 8 to 10, wherein the grooves in adjacent leads are formed at zigzag positions.

12. A method as claimed in claim 7, wherein the outer lead portions are exposed in top and bottom, and left and right sides of the molded body for dissipation of a heat generated in operation of the upper and lower chips.

13. A method for fabricating a chip stack type semiconductor package, comprising:

applying an adhesive layer on a surface of a first chip, the first chip including a center pad formation surface oppositely facing the adhesive layer, the center pad formation surface having left and right sides, and including a first set of center pads;

attaching a second chip to the adhesive layer, thereby stacking the second chip with respect to the adhesive layer and the first chip, the second chip including a center pad formation surface oppositely facing the adhesive layer, the center pad formation surface having left and right sides, and including a second set of center pads;

attaching a first end of a left lead to the first chip on the left side of the first set of center pads, then attaching a second end of the left lead to the second chip on the left side of the second set of center pads, thereby attaching the second end directly opposite the first end;

attaching a first end of a right lead to the first chip on the right side of the first set of center pads, then attaching a second end of the right lead to the second chip on the right side of the second set of center pads, thereby attaching the second end directly opposite the first end;

electrically connecting using conductive connection members the first ends to respective center pas of the first set center pads, and connecting the second ends to respective center pads of the second set of center pads.

14. The method as claimed in claim 13, further including applying a resin encapsulation to protect the first and second chips and the conductive connection members forming a molded body.

15. The method as claimed in claim 14, further including attaching external power source connection terminals to a portion of the left and right leads that are located outside the molded body.

16. The method as claimed in claim 14, further including forming grooves on a portion of the left and right leads that are located outside the molded body.

17. The method as claimed in claim 16, further including patterning the grooves in the leads in a zigzag arrangement.

18. The method as claimed in claim 16, further including welding the external power source connection terminals into the grooves of the left and right leads.

19. The method a claimed in claim 13, further including pre-forming the left and right leads into C-shaped members.

\* \* \* \* \*